United States Patent
Hessenius et al.

(10) Patent No.: US 12,057,675 B1
(45) Date of Patent: Aug. 6, 2024

(54) ELECTRIC PUMPING VERTICAL EXTERNAL CAVITY SURFACE EMITTING LASER (EP-VECSEL) ARRAY

(71) Applicant: DeUVe Photonics, Inc., Tucson, AZ (US)

(72) Inventors: Chris Hessenius, Tucson, AZ (US); Mahmoud Fallahi, Tucson, AZ (US)

(73) Assignee: DEUVE PHOTONICS, INC., Tucson, AZ (US)

( * ) Notice: Subject to any disclaimer, the term of this patent is extended or adjusted under 35 U.S.C. 154(b) by 0 days.

(21) Appl. No.: 18/501,534

(22) Filed: Nov. 3, 2023

Related U.S. Application Data

(60) Provisional application No. 63/512,034, filed on Jul. 5, 2023.

(51) Int. Cl.
*H01S 5/00* (2006.01)
*H01S 5/0225* (2021.01)
(Continued)

(52) U.S. Cl.
CPC ............ *H01S 5/005* (2013.01); *H01S 5/0225* (2021.01); *H01S 5/0421* (2013.01); *H01S 5/18361* (2013.01); *H01S 5/423* (2013.01)

(58) Field of Classification Search
CPC ...... H01S 5/005; H01S 5/0225; H01S 5/0421; H01S 5/18361; H01S 5/423
See application file for complete search history.

(56) References Cited

U.S. PATENT DOCUMENTS

| 5,119,024 A | 6/1992 | Popovic et al. |
| 7,723,985 B2 | 5/2010 | Smith |

(Continued)

FOREIGN PATENT DOCUMENTS

WO WO-2004064211 A1 * 7/2004 ............ H01S 5/423

OTHER PUBLICATIONS

Shin, David. Nonlocal correlations between freely propagating pairs of atoms. Diss. the Australian National University (Australia), 2022.
(Continued)

*Primary Examiner* — Yuanda Zhang
(74) *Attorney, Agent, or Firm* — NGUYEN TARBET IP LAW

(57) ABSTRACT

An electrical pumping vertical external-cavity surface-emitting laser (EP-VECSEL) device. The device may comprise a bottom contact, a first distributed Bragg reflector (DBR) disposed on the bottom contact, and an active region comprising a plurality of emitters, disposed on the first DBR configured to accept an electrical current at multiple emitters on the active region such that the multiple emitters produce a plurality of lasers. The multiple emitters may be configured to form a desired Hermite Gaussian (HG) mode shape. The device may further comprise a second DBR disposed on the active region and a top contact disposed on the second DBR. The top contact may be shaped such that the plurality of lasers are directed through the top contact. The device may further comprise an array output coupler disposed optically in line with the top contact such that the plurality of lasers are directed into the array output coupler.

17 Claims, 7 Drawing Sheets

(51) Int. Cl.
  *H01S 5/042*  (2006.01)
  *H01S 5/183*  (2006.01)
  *H01S 5/42*   (2006.01)

(56) References Cited

U.S. PATENT DOCUMENTS

| | | |
|---|---|---|
| 8,422,119 B1 | 4/2013 | Keaton et al. |
| 9,568,565 B2 | 2/2017 | Parsa et al. |
| 9,684,041 B2 | 6/2017 | Nagasak et al. |
| 2004/0252734 A1 | 12/2004 | Karpushko |
| 2011/0175604 A1 | 7/2011 | Polzer et al. |
| 2013/0021602 A1 | 1/2013 | Dribinski et al. |
| 2015/0071316 A1 | 3/2015 | Chuang |
| 2015/0311673 A1* | 10/2015 | Wang ................ H01S 5/18305 372/27 |
| 2017/0212177 A1 | 7/2017 | Coar et al. |
| 2017/0212180 A1 | 7/2017 | Hahn et al. |
| 2017/0212186 A1 | 7/2017 | Hahn et al. |
| 2018/0337516 A1* | 11/2018 | Tatum ................ H01S 5/18338 |

OTHER PUBLICATIONS

Steinert et al. "High sensitivity magnetic imaging using an array of spins in diamond." Review of scientific instruments 81.4 (2010).
Hannegan II, John Michael. Experiments with Frequency Converted Photons from a Trapped Atomic Ion. Diss. University of Maryland, College Park, 2022.

\* cited by examiner

ELECTRIC PUMPING VERTICAL EXTERNAL CAVITY SURFACE EMITTING LASER (EP-VECSEL) ARRAY

CROSS-REFERENCES TO RELATED APPLICATIONS

This application is a non-provisional and claims benefit of U.S. Provisional Application No. 63/512,034 filed Jul. 5, 2023, the specification of which is incorporated herein in its entirety by reference.

FIELD OF THE INVENTION

The present invention is directed to an Electrical Pumping Vertical External Cavity Surface Emitting Lasers (EP-VECSEL) device comprising multiple pumping areas for configurable Hermite Gaussian (HG) mode shape generation.

BACKGROUND OF THE INVENTION

Electrically pumped lasers are, in general, preferred over optically pumped. However, for many types of lasers, electrical pumping schemes are not feasible. Vertical External Cavity Surface Emitting Lasers (VECSELs) are semiconductor lasers that are typically optically pumped. There have been demonstrations of electrically pumped VECSELs, but there are limitations in achievable output power levels. This is mostly due to difficulties with carrier injection into the device's active region, which limits the area that can be pumped, thus reducing the possible output power. Optically pumped VECSELs do not have these issues and can easily power scale by increasing the pumping area.

Recently, VECSELs have been developed that emit outputs in higher-order Hermite Gaussian (HG) profiles. These HG modes can then be converted into Laguerre Gaussian (LG) modes that have unique properties. These LG modes are known to carry orbital angular momentum and have "self-healing" properties that allow for excellent transmission in turbulent media. These HG beams were obtained by optically pumping the VECSEL gain chip in the desired pattern. These specialized VECSELS have three main novelties: electrical pumping for higher order HG modes, coherent or incoherent beam combining, and alteration of propagating beam shape to account for interference or obstructions. FIG. 1 shows a simple configuration of an electrically pumped VECSEL. This has previously been demonstrated, but there are limitations in power scaling, as discussed before. Thus, there exists a present need for an electrical pumping VECSEL design that can account for these power scaling issues.

BRIEF SUMMARY OF THE INVENTION

It is an objective of the present invention to provide devices that allow for an Electrical Pumping Vertical External Cavity Surface Emitting Lasers (EP-VECSEL) device comprising multiple pumping areas for configurable Hermite Gaussian (HG) mode shape generation, as specified in the independent claims. Embodiments of the invention are given in the dependent claims. Embodiments of the present invention can be freely combined if they are not mutually exclusive.

The present invention features an electrical pumping vertical external-cavity surface-emitting laser (EP-VECSEL) device. In some embodiments, the EP-VECSEL device may comprise a bottom contact, a first distributed Bragg reflector (DBR) disposed on the bottom contact, and an active region comprising a plurality of emitters disposed on the first DBR configured to accept an electrical current at two or more emitters on the active region such that the two or more emitters produce a plurality of lasers. The two or more emitters may be configured to form a desired Hermite Gaussian (HG) mode shape. The EP-VECSEL device may further comprise a second DBR disposed on the active region and a top contact disposed on the second DBR. The top contact may be shaped such that the plurality of lasers are directed through the top contact. The EP-VECSEL device may further comprise an array output coupler disposed optically in line with the top contact such that the plurality of lasers are directed into the array output coupler.

Expanding on the electrical pumping VECSEL concept, multiple areas can be pumped on a single VECSEL chip to create patterns that match a desired HG mode shape. FIG. 2 shows how this can be done in an electrical pumping scheme. This figure shows an $HG_{1,1}$ mode, but the concept can be applied to any mode configuration. This design allows for a more uniform injection of carriers into the active region of the device and also creates a "mask" that further defines the output pattern of the VECSEL laser. Now, similar to the TV Pixel array, we can activate individual lasers and control beam shape for each. As shown in FIG. 3, an array of VECELs can be created such that a multitude of individual VECSELs can be created.

One of the unique and inventive technical features of the present invention is the implementation of a configurable array of VECSEL lasers disposed on a single EP-VECSEL chip. Without wishing to limit the invention to any theory or mechanism, it is believed that the technical feature of the present invention advantageously provides for an EP-VECSEL device capable of efficient power scaling. None of the presently known prior references or work has the unique, inventive technical feature of the present invention.

Furthermore, the inventive feature of the present invention is counterintuitive. The reason that it is counterintuitive is because it contributed to a surprising result. One skilled in the art would not implement multiple VECSEL lasers on one chip due to the difficulties in coherent beam combining of the multiple lasers into a preferred shape. The present invention implements multiple schemes for combining the lasers into a single output, including laser portion sampling or mechanical movement of the beams through the use of a piezoelectric element. Surprisingly, this allows for the present invention to implement multiple lasers to derive a combined output with any desired HG mode shape. Thus, the feature of the present invention contributed to a surprising result.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

BRIEF DESCRIPTION OF THE SEVERAL VIEWS OF THE DRAWING(S)

The features and advantages of the present invention will become apparent from a consideration of the following detailed description presented in connection with the accompanying drawings in which.

DETAILED DESCRIPTION OF THE INVENTION

Following is a list of elements corresponding to a particular element referred to herein:
- 100 device
- 110 bottom contact
- 120 active region
- 121 CVD diamond
- 122 EP-VECSEL
- 123 intracavity CVD
- 124 etalon
- 125 microlens array
- 126 emitter output coupler
- 130 first DBR
- 140 second DBR
- 150 top contact
- 155 anti-reflective coating
- 160 array output coupler
- 200 power supply
- 300 beam intrusion monitor
- 400 targeting and relay system
- 500 PV array
- 600 battery
- 700 second beam intrusion monitor The term "Hermite-Gaussian (HG) mode shape" is defined herein as a shape of a beam of electromagnetic radiation with high monochromaticity whose amplitude envelope in the transverse plane is given by a Gaussian function determined by a system of mutually orthogonal functions.

The term "etalon" is defined herein as an optical device containing parallel mirrors, used as a narrow band filter, often in laser design.

The term "astigmatic mode converter" is defined herein as a mode converter that transforms a Hermite-gaussian mode of arbitrarily high order to a Laguerre-gaussian mode and vice versa.

The terms "N-type distributed Bragg reflector (DBR)" and "P-type DBR" are defined herein as reflectors used in waveguides, such as optical fibers, formed from multiple layers of alternating materials with different refractive index, or by periodic variation of some characteristic (such as height) of a dielectric waveguide, resulting in periodic variation in the effective refractive index in the guide. An N-type DBR may be doped such that the DBR comprises excess electrons. A P-type DBR may be doped such that the DBR comprises excess holes.

The term "chemical vapor deposition (CVD) diamond" refers to a diamond generated by a vacuum deposition method, wherein a wafer (substrate) is exposed to one or more volatile precursors, which react and/or decompose on the substrate surface to produce the desired deposit (the diamond).

The term "VECSEL" (Vertical External Cavity Surface Emitting Laser) is referred to herein as a semiconductor laser with an external laser cavity, where the laser light propagates perpendicular to the semiconductor wafer surface.

The term "electrical pumping" is referred to herein as passing an electric current through a gain medium to excite the atoms or molecules.

Figure 1:
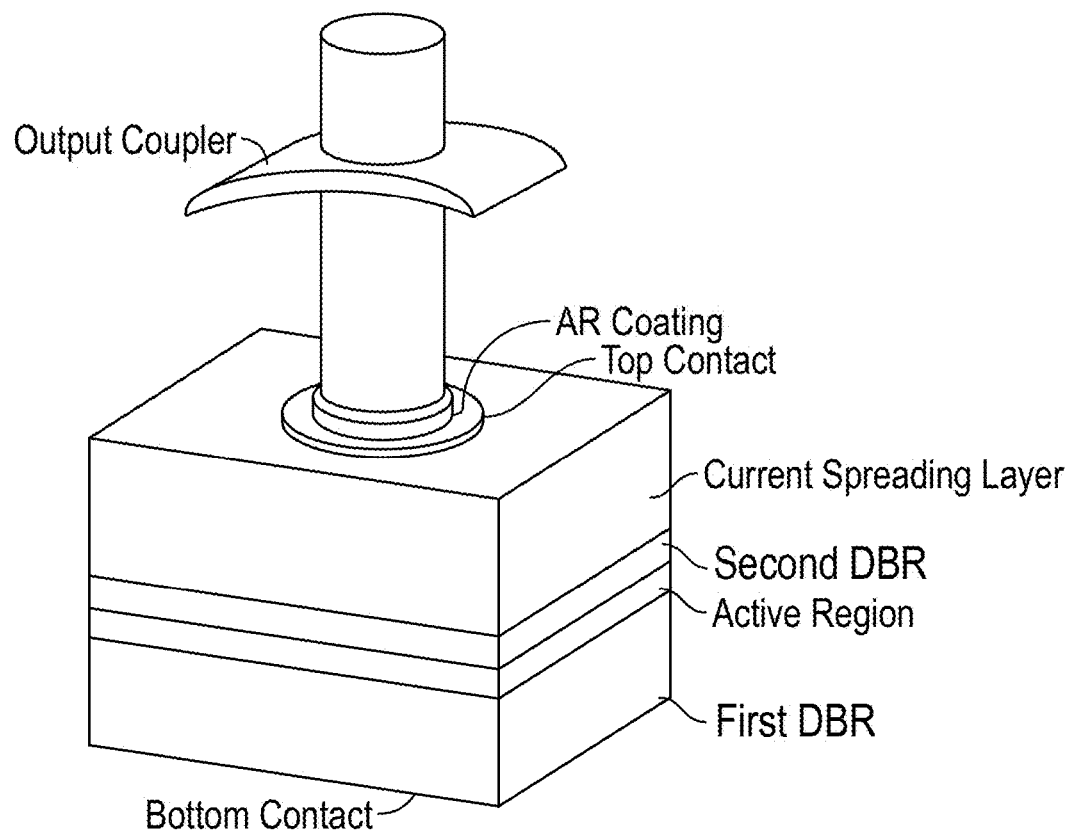
FIG. 1 shows a simple prior electrical pumped VECSEL design.
Figure 2:
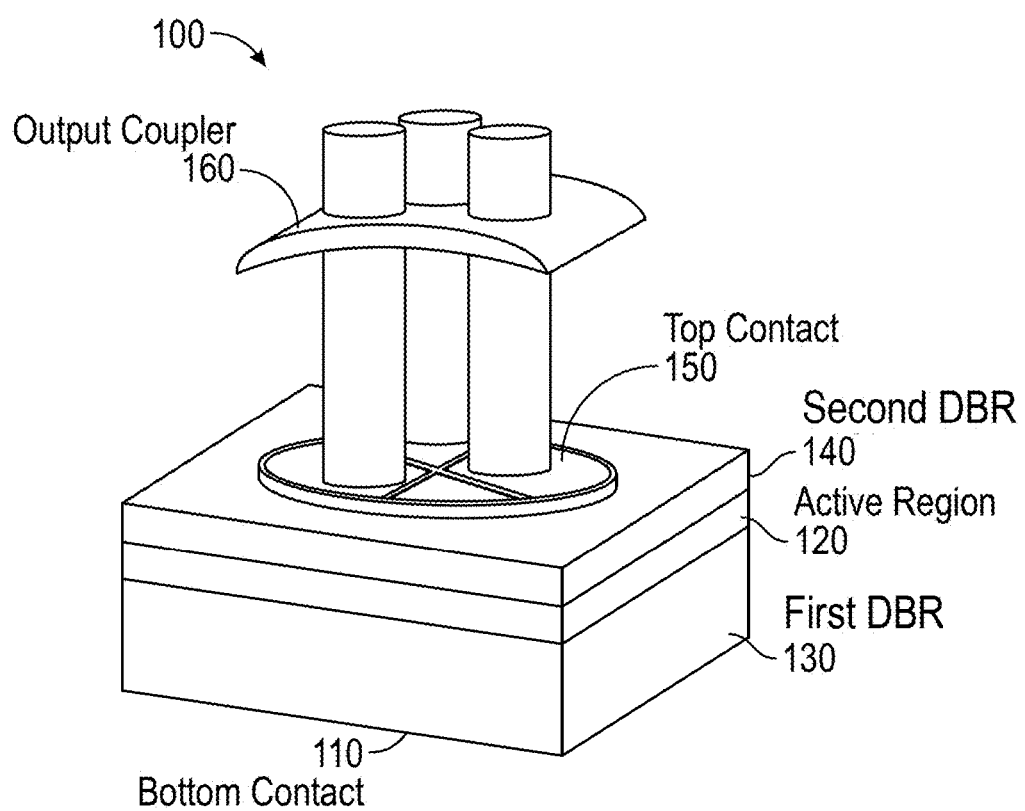
FIG. 2 shows a design of an electrical pumping scheme for higher-order HG modes from a VECSEL.

Referring now to FIG. 2, the present invention features an electrical pumping vertical external-cavity surface-emitting laser (EP-VECSEL) device (100). In some embodiments, the device (100) may comprise a bottom contact (110), a first distributed Bragg reflector (DBR) (130) disposed on the bottom contact (110), and an active region (120) comprising a plurality of emitters, disposed on the first DBR (130) configured to accept an electrical current at two or more emitters on the active region (120) such that the two or more emitters produce a plurality of lasers. The two or more emitters may be configured to form a desired Hermite Gaussian (HG) mode shape. The device (100) may further comprise a second DBR (140) disposed on the active region (120) and a top contact (150) disposed on the second DBR (140). The top contact (150) may be shaped such that the plurality of lasers are directed through the top contact (150). The device (100) may further comprise an array output coupler (160) disposed optically in line with the top contact (150) such that the plurality of lasers are directed into the array output coupler (160).

In some embodiments, the first DBR (130) may comprise an N-type DBR, a P-type DBR, or a combination thereof. In some embodiments, the second DBR (140) may comprise an N-type DBR, a P-type DBR, or a combination thereof.

In some embodiments, the bottom contact may comprise a substrate of a metal material. In some embodiments, the top contact may comprise a ring of a metal material. In some embodiments, the device may further comprise an electrical current generator for actuating the two or more emitters in the active region (120). In some embodiments, an output coupler may be defined as a semi-transparent dielectric mirror.

In some embodiments, each emitter of the plurality of emitters may comprise a chemical vapor deposition (CVD) diamond (121), an EP-VECSEL (122) disposed on the CVD diamond (121), an intracavity CVD diamond (123) disposed at least partially within a cavity disposed in the EP-VECSEL (122), an etalon (124) disposed parallel to and optically in line with the intracavity CVD diamond (123), a microlens array (125) disposed parallel to and optically in line with the etalon (124), and an emitter output coupler (126) disposed parallel to and optically in line with the microlens array (125). In some embodiments, the device (100) may further comprise a piezoelectric element operatively coupled to the emitter output coupler (126) of each emitter of the plurality of emitters, configured to move the emitter output coupler (126) such that a shape of the laser emitted by the emitter is changed. In some embodiments, the intracavity CVD diamond (123) may be fully disposed within the cavity, mostly disposed within the cavity, or mostly disposed outside of the cavity.

In some embodiments, the device (100) may further comprise a sampling component configured to sample a portion of the laser emitted by each emitter of the two or more emitters and lock a wavelength and phase of each emitter. In some embodiments, each laser of the plurality of lasers may comprise an HG beam. In some embodiments, the device (100) may further comprise an astigmatic mode converter disposed optically in line with the array output coupler (160), configured to convert the plurality of lasers from HG beams to Laguerre Gaussian (LG) beams. In some embodiments, the original emitters may have a common output coupler and combine to form a single "higher order mode." In some embodiments, the system may comprise many output couplers configured to form a single laser beam through coherent beam combining. In some embodiments, the coherent beam combining may be accomplished with a piezoelectric element to control phase or by changing the current to each "pixel."

Figure 5:
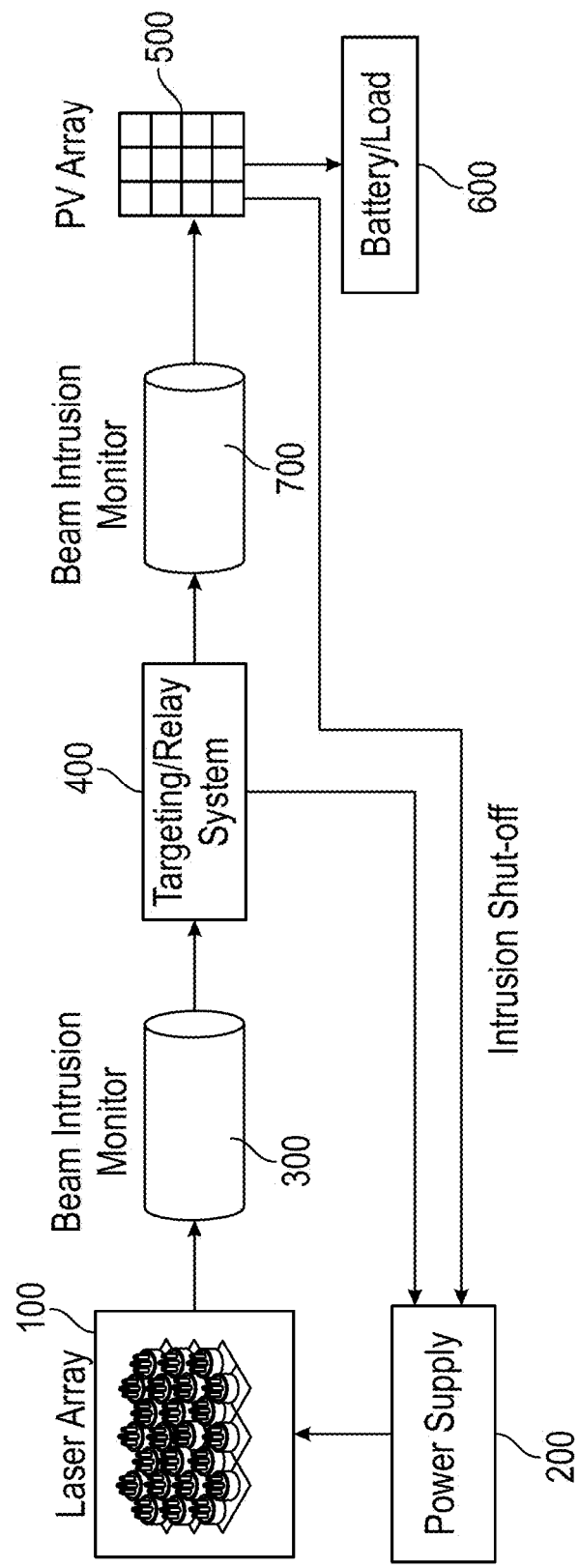
FIG. 5 shows a scheme in which the VECSEL laser array can be implemented for free space beam transfer.

Referring now to FIG. 5, the present invention features an electrical pumping vertical external-cavity surface-emitting laser (EP-VECSEL) system. In some embodiments, the system may comprise a power supply (200) and an EP-VECSEL device (100). The array may comprise a bottom contact (110), a first distributed Bragg reflector (DBR) (130) disposed on the bottom contact (110), and an active region (120) comprising a plurality of emitters disposed on the first DBR (130) configured to accept an electrical current at two or more emitters on the active region (120) such that the two or more emitters produce a plurality of lasers. The two or more emitters may be configured to form a desired Hermite Gaussian (HG) mode shape. The EP-VECSEL device (100) may further comprise a second DBR (140) disposed on the active region (120) and a top contact (150) disposed on the second DBR (140). The top contact (150) may be shaped such that the plurality of lasers are directed through the top contact (150). The EP-VECSEL device (100) may further comprise an array output coupler (160) disposed optically in line with the top contact (150) such that the plurality of lasers are directed into the array output coupler (160).

The system may further comprise a beam intrusion monitor (300) optically in line with the EP-VECSEL device (100), a targeting and relay system (400) operatively coupled to the beam intrusion monitor (300), a photovoltaic (PV) array (500) operatively coupled to the targeting and relay system (400), and a battery (600) operatively coupled to the PV array (500). In some embodiments, the system may further comprise a second beam intrusion monitor (700) operatively coupled to the targeting and relay system (400) and the PV array (500). This system may be used for perimeter alarm monitoring purposes. The beam intrusion monitors may be configured to detect an interruption in the beam(s) generated by the EP-VECSEL device of the present invention and generate a signal if an interruption is detected. This signal is sent to the targeting/relay system, which closes the circuit and shuts down the power supply in response to the signal, which activates an external alarm. The PV array is a power-generating component that provides power to both the power supply and the battery/load in response to light, thus energizing the system.

However, this perimeter alarm monitoring embodiment of the present invention is a non-limiting example, and the EP-VECSEL device of the presently claimed invention applies to any VECSEL-implemented device, such as laser cooling, spectroscopy, telecommunications, light sources for sensing applications (gas sensing, biomedical sensing, etc.), face and gesture recognition, proximity sensors, augmented reality displays, Light Detection and Ranging (LIDAR) systems for robotics, unmanned aerial vehicles, and autonomous cars, laser printers, optical mice, and smartphones.

Figure 4:
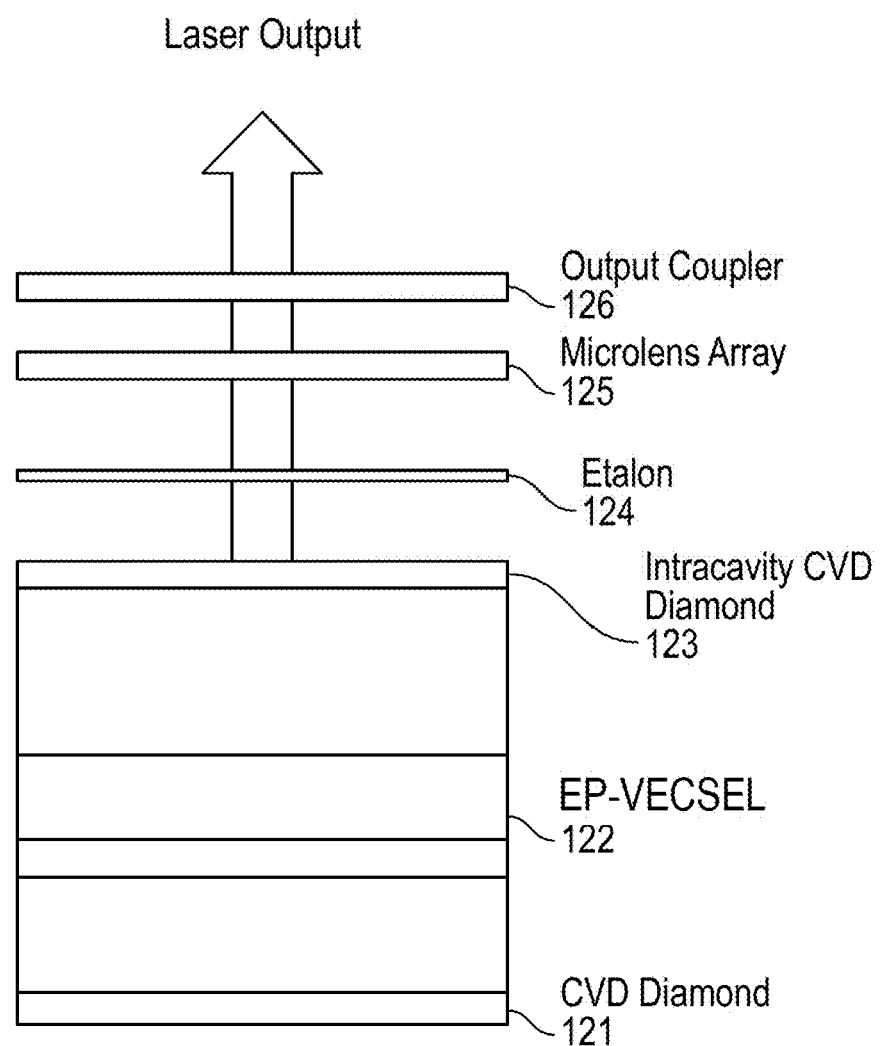
FIG. 4 shows a schematic of each "pixel" and possible elements to be included.

FIG. 4 shows possible designs for each laser emitter. Here each "pixel" of the array can contain several elements, including but not limited to output couplers, lens arrays, etalons, filters, nonlinear crystals, etc. For coherent beam combining of the individual emitters, several schemes could be implemented. Typically, this would involve "sampling" a portion of the output from each emitter and locking the wavelength and phase of each emitter. Here, the best option would be a simple scheme that could adjust the electrical current to each emitter which would slightly adjust the wavelength of each emitter. Another option would be to add mechanical movement to the output coupler of each emitter which could be done with a piezoelectric element. This would be similar to adaptive optics that deform mirrors to account for atmospheric interference. To reiterate, each pixel (VECSEL pump spot area) can produce a variety of beam shapes or output powers. The pumping level, for example, can be used to control the phase for coherent beam combining. The current supplied to each pixel can also control the beam shape. The current can also control the optical phase of each "pixel" for coherent beam combining.

The scheme shown below in FIG. 5 shows one possible configuration for transferring laser energy from the source to the receiver. This is a simple configuration with a non-coherent beam combining for free-space laser energy transport. Of course, coherent beam combining could be implemented, as indicated earlier. In this scheme, it is possible to compensate for atmospheric interference/obstructions first by changing the beam shape and second by converting the HG beams emitted by the array into LG beams. These types of beams have been shown to propagate over longer distances. This allows the array to keep max power on target and also allows for the ability to maintain a desired beam pattern. As shown in the figure, additional features, including photovoltaics, beam monitors, relay systems, etc., can also be included.

In some embodiments, the top contact may further comprise an anti-reflective (AR) coating (155) to prevent the reflection of lasers to increase pump absorption and overall efficiency. The AR coating may comprise $SiO_2$, $Al_2O_3$, $Ta_2O_5$, $TiO_2$, or a combination thereof.

Figure 3:
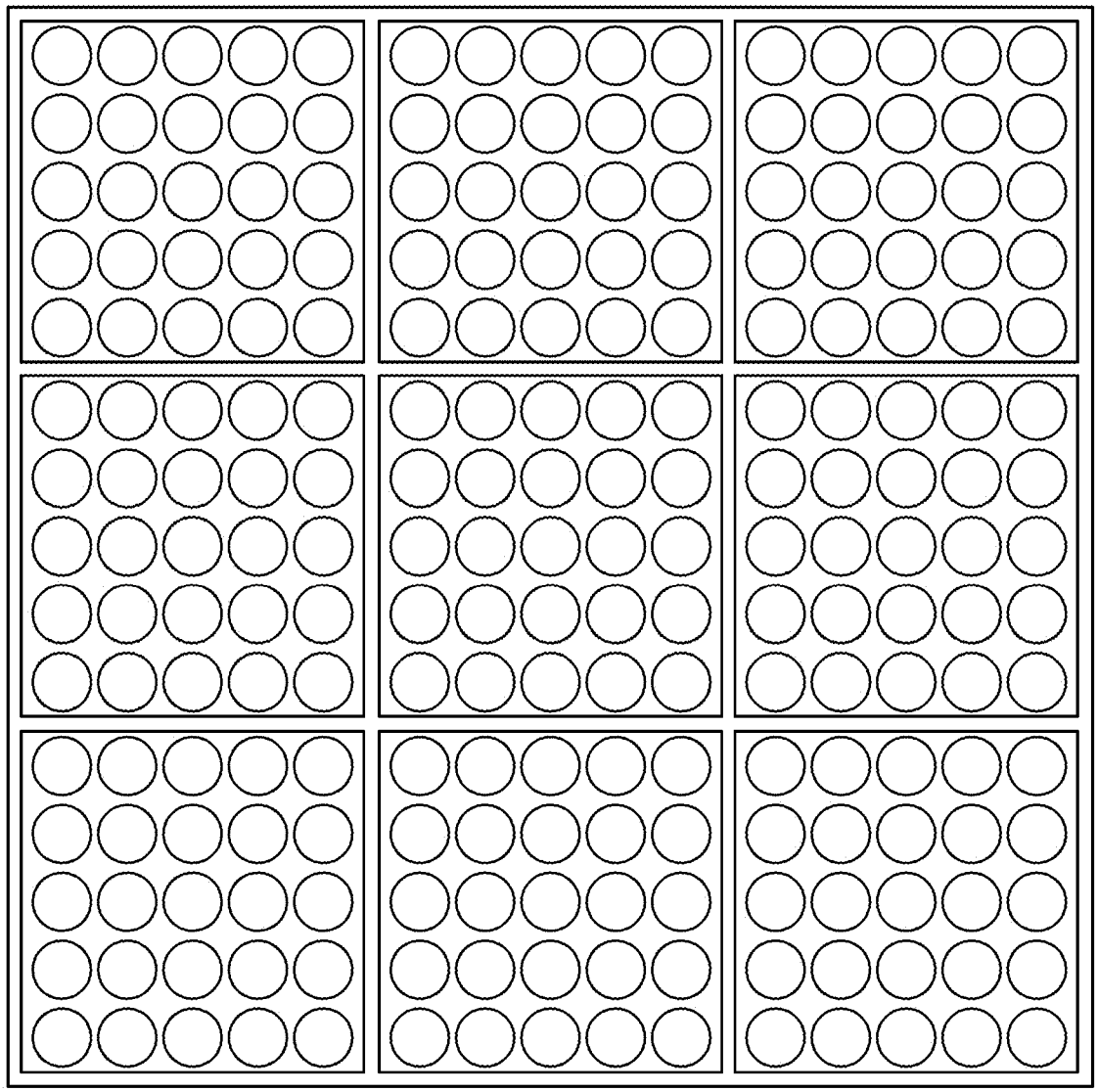
FIG. 3 shows an array of individual VECSEL lasers. Each "dot" on the image can emit a laser beam of any designed HG order, including a diffraction-limited $HG_{0,0}$ Gaussian beam.

In some embodiments, as shown in FIG. 3, the active region of the EP-VECSEL of the present invention may comprise one or more sub-regions, each comprising one or more emitters. In some embodiments, the active region may comprise 1 to 50 sub-regions arranged in a square grid shape, a rectangular grid shape, or any polygonal shape encompassed by the active region. In some embodiments, each sub-region may comprise 1 to 100 emitters arranged in a square grid shape, a rectangular grid shape, or any polygonal shape encompassed by the sub-region.

In some embodiments, the microlens array (125) may comprise one or more rigid one- or two-dimensional arrangements of very tiny lenses, each with a diameter of 10 mm or less. A shape of each lens may comprise a square, a circle, a hexagon, a rectangle, or any other polygonal shape.

Figure 6:
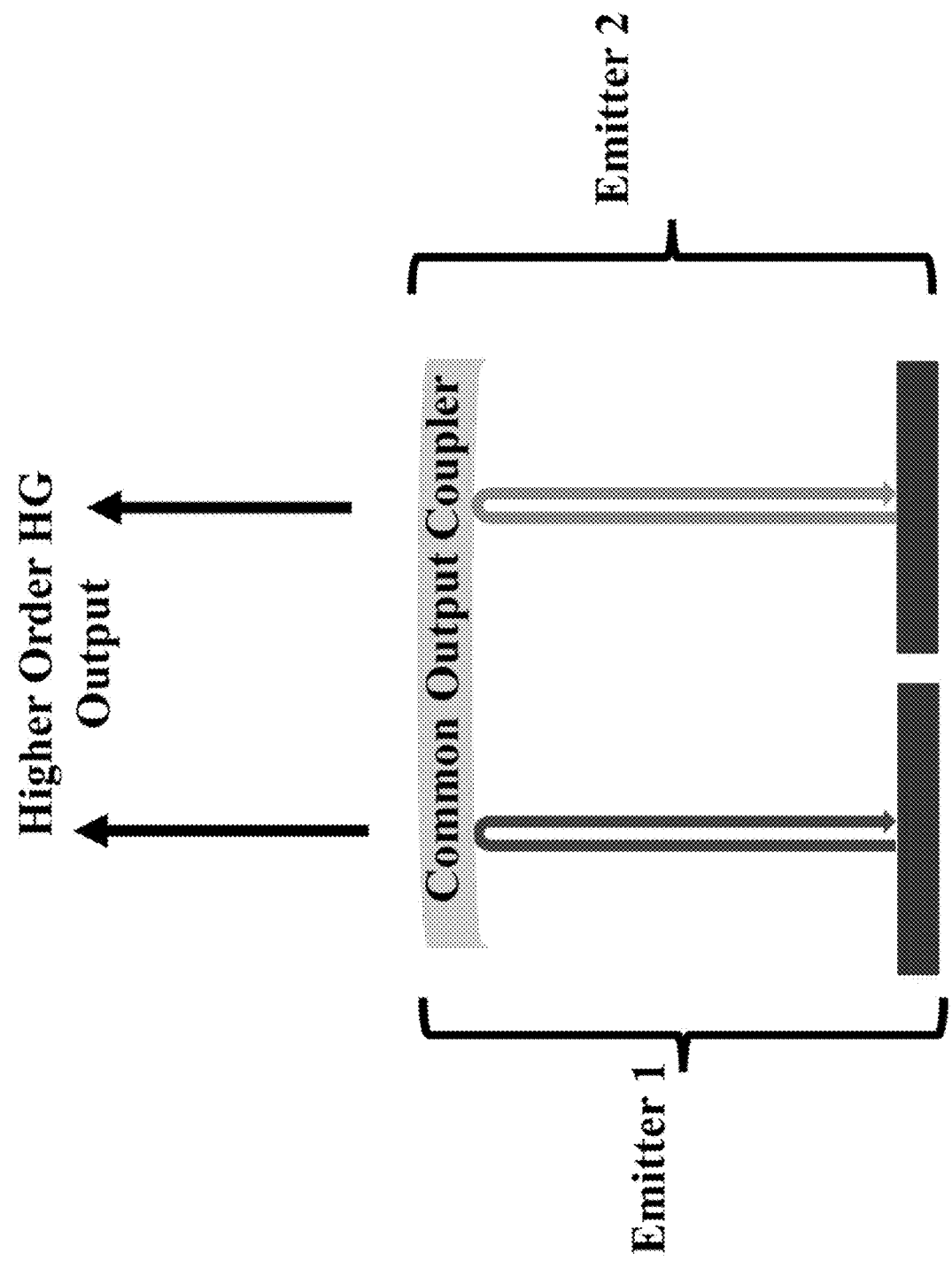
FIG. 6 shows a plurality of emitters in-line with a common output coupler.

Referring now to FIG. 6, in some embodiments, the device may comprise one common output coupler that covers all emitters of the active region of the device. Current can be directed to each emitter independently to turn on the desired emitters to create the desired HG transverse Beam profile. This HG beam can then be modified via an astigmatic mode converter to generate Lg-shaped transverse profile beams. In some embodiments, each emitter may additionally be in line with one or more lens arrays, one or more mirror arrays, or a combination thereof.

Figure 7:
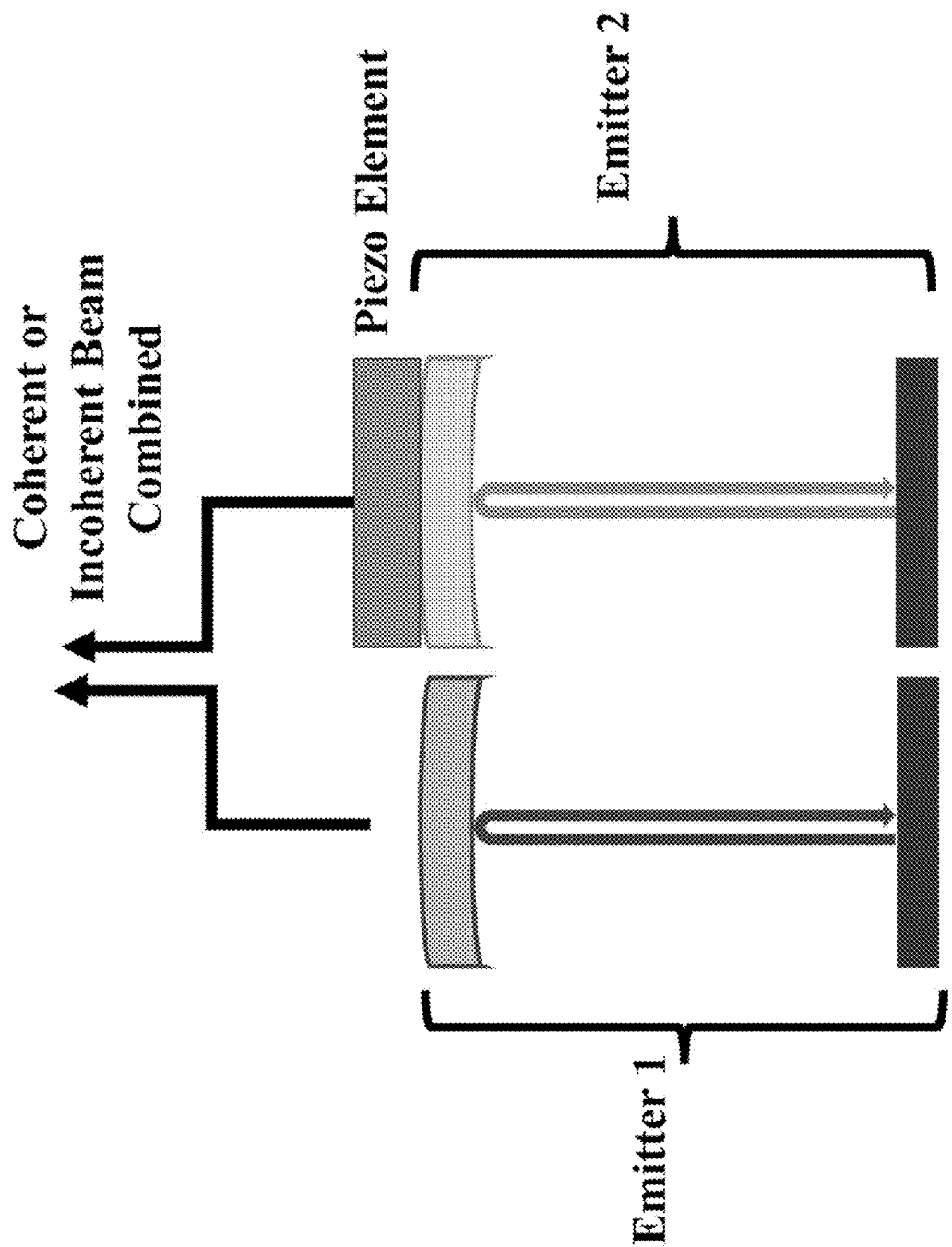
FIG. 7 shows a plurality of emitters each having its own individual laser cavity. The beams from the plurality of emitters are then combined.

Referring now to FIG. 7, in some embodiments, the plurality of emitters may all form individual laser cavities all acting independently and combining to generate the output of an incoherently combined laser beam. With the addition of a piezo element, the cavity length of each individual laser emitter can be changed, thus changing the optical phase of each laser. Through proper monitoring, the beams may then be combined coherently. Another method for coherent beam combining would be to change the current applied to each pixel which changes the thermal lensing of the semiconductor material which will in turn control the phase of each pixel. As with the use of a piezo, through proper monitoring, all the phases of the individual pixel emitters can be aligned for coherent beam combining.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims. In some embodiments, the figures presented in this patent application are drawn to scale, including the angles, ratios of dimensions, etc. In some embodiments, the figures are representative only, and the claims are not limited by the dimensions of the figures. In some embodiments, descriptions of the inventions described herein using the phrase "comprising" includes embodiments that could be described as "consisting essentially of" or "consisting of," and as such, the written description requirement for claiming one or more embodiments of the present invention using the phrase "consisting essentially of" or "consisting of" is met.

The reference numbers recited in the below claims are solely for ease of examination of this patent application, and are exemplary, and are not intended in any way to limit the scope of the claims to the particular features having the corresponding reference numbers in the drawings.

What is claimed is:

1. An electrical pumping vertical external-cavity surface-emitting laser (EP-VECSEL) device (100) comprising:
   a. a bottom contact (110);
   b. a first distributed Bragg reflector (DBR) (130) disposed on the bottom contact (110);
   c. an active region (120) comprising a plurality of emitters, disposed on the first DBR (130) and configured to accept an electrical current at two or more emitters on the active region (120) such that the two or more emitters produce a plurality of lasers, each emitter of the plurality of emitters comprising:
      i. a chemical vapor deposition (CVD) diamond (121);
      ii. an EP-VECSEL (122) disposed on the CVD diamond (121);
      iii. an intracavity CVD diamond (123) disposed at least partially within a cavity disposed in the EP-VECSEL (122);
      iv. an etalon (124) disposed parallel to and optically in line with the intracavity CVD diamond (123);
      v. a microlens array (125) disposed parallel to and optically in line with the etalon (124); and
      vi. an emitter output coupler (126) disposed parallel to and optically in line with the microlens array (125); wherein the two or more emitters are configured to form a desired Hermite Gaussian (HG) mode shape;
   d. a second DBR (140) disposed on the active region (120);
   e. a top contact (150) disposed on the second DBR (140), wherein the top contact (150) is shaped such that the plurality of lasers are directed through the top contact (150); and
   f. an array output coupler (160) disposed optically in line with the top contact (150) such that the plurality of lasers are directed into the array output coupler (160).

2. The EP-VECSEL device (100) of claim 1 further comprising a piezoelectric element operatively coupled to the emitter output coupler (126) of each emitter of the plurality of emitters, configured to move the emitter output coupler (126) such that a shape of the laser emitted by the emitter is changed.

3. The EP-VECSEL device (100) of claim 1 further comprising a sampling component configured to sample a portion of the laser emitted by each emitter of the two or more emitters and lock a wavelength and phase of each emitter.

4. The EP-VECSEL device (100) of claim 1, wherein each laser of the plurality of lasers comprises an HG beam, wherein the device (100) further comprises an astigmatic mode converter disposed optically in line with the array output coupler (160), configured to convert the plurality of lasers from HG beams to Laguerre Gaussian (LG) beams.

5. An electrical pumping vertical external-cavity surface-emitting laser (EP-VECSEL) device (100) comprising:
   a. an active region (120) comprising a plurality of emitters, configured to accept an electrical current at two or more emitters of the plurality of emitters such that the two or more emitters produce a plurality of lasers, each emitter of the plurality of emitters comprising:
      i. a chemical vapor deposition (CVD) diamond (121);
      ii. an EP-VECSEL (122) disposed on the CVD diamond (121);
      iii. an intracavity CVD diamond (123) disposed at least partially within a cavity disposed in the EP-VECSEL (122);
      iv. an etalon (124) disposed parallel to and optically in line with the intracavity CVD diamond (123);
      v. a microlens array (125) disposed parallel to and optically in line with the etalon (124); and
      vi. an emitter output coupler (126) disposed parallel to and optically in line with the microlens array (125); wherein the two or more emitters are configured to form a desired Hermite Gaussian (HG) mode shape; and
   b. an array output coupler (160) disposed optically in line with the active region (120) such that the plurality of lasers are directed into the array output coupler (160).

6. The EP-VECSEL device (100) of claim 5 further comprising a piezoelectric element operatively coupled to the emitter output coupler (126) of each emitter of the plurality of emitters, configured to move the emitter output coupler (126) such that a shape of the laser emitted by the emitter is changed.

7. The EP-VECSEL device (100) of claim 5 further comprising a sampling component configured to sample a portion of the laser emitted by each emitter of the two or more emitters, and lock a wavelength and phase of each emitter.

8. The EP-VECSEL device (100) of claim 5, wherein each laser of the plurality of lasers comprises an HG beam.

9. The EP-VECSEL device (100) of claim 8 further comprising an astigmatic mode converter disposed optically in line with the array output coupler (160), configured to convert the plurality of lasers from HG beams to Laguerre Gaussian (LG) beams.

10. The EP-VECSEL device (100) of claim 5, wherein the EP-VECSEL device (100) is applied to systems for perimeter alarm monitoring, laser cooling, spectroscopy, telecommunications, light sources for sensing applications (gas sensing, biomedical sensing, etc.), face and gesture recognition, proximity sensors, augmented reality displays, Light Detection and Ranging (LIDAR) systems for robotics, unmanned aerial vehicles, and autonomous cars, laser printers, optical mice, smartphones, or a combination thereof.

11. An electrical pumping vertical external-cavity surface-emitting laser (EP-VECSEL) system comprising:
   a. a power supply (200);
   b. an EP-VECSEL device (100) comprising:
      i. a bottom contact (110);
      ii. a first distributed Bragg reflector (DBR) (130) disposed on the bottom contact (110);
      iii. an active region (120) comprising a plurality of emitters, disposed on the first DBR (130) configured to accept an electrical current at two or more emitters on the active region (120) such that the two or more emitters produce a plurality of lasers;
         wherein the two or more emitters are configured to form a desired Hermite Gaussian (HG) mode shape;
      iv. a second DBR (140) disposed on the active region (120);
      v. a top contact (150) disposed on the second DBR (140), wherein the top contact (150) is shaped such that the plurality of lasers are directed through the top contact (150); and
      vi. an array output coupler (160) disposed optically in line with the top contact (150) such that the plurality of lasers are directed into the array output coupler (160);
   c. a beam intrusion monitor (300) optically in line with the EP-VECSEL device (100);
   d. a targeting and relay system (400) operatively coupled to the beam intrusion monitor (300);
   e. a photovoltaic (PV) array (500) operatively coupled to the targeting and relay system (400); and
   f. a battery (600) operatively coupled to the PV array (500).

12. The system of claim 11 further comprising a second beam intrusion monitor (700) operatively coupled to the targeting and relay system (400) and the PV array (500).

13. The system of claim 11, wherein each emitter of the plurality of emitters comprise:
   a. a chemical vapor deposition (CVD) diamond (121);
   b. an EP-VECSEL (122) disposed on the CVD diamond (121);
   c. an intracavity CVD diamond (123) disposed at least partially within a cavity disposed in the EP-VECSEL (122);
   d. an etalon (124) disposed parallel to and optically in line with the intracavity CVD diamond (123);
   e. a microlens array (125) disposed parallel to and optically in line with the etalon (124); and
   f. an emitter output coupler (126) disposed parallel to and optically in line with the microlens array (125).

14. The system of claim 13 further comprising a piezoelectric element operatively coupled to the emitter output coupler (126) of each emitter of the plurality of emitters, configured to move the emitter output coupler (126) such that a shape of the laser emitted by the emitter is changed.

15. The system of claim 11 further comprising a sampling component configured to sample a portion of the laser emitted by each emitter of the two or more emitters, and lock a wavelength and phase of each emitter.

16. The system of claim 11, wherein each laser of the plurality of lasers comprises an HG beam.

17. The system of claim 16 further comprising an astigmatic mode converter disposed optically in line with the array output coupler (160), configured to convert the plurality of lasers from HG beams to Laguerre Gaussian (LG) beams.

* * * * *